(12) United States Patent
Booker et al.

(10) Patent No.: US 9,754,988 B2
(45) Date of Patent: Sep. 5, 2017

(54) LARGE FORMAT ARRAYS AND METHODS

(75) Inventors: Philip Stephen Karl Booker, Southampton (GB); Ian M. Baker, Southampton (GB)

(73) Assignee: LEONARDO MW LTD, Essex (GB)

(*) Notice: Subject to any disclaimer, the term of this patent is extended or adjusted under 35 U.S.C. 154(b) by 937 days.

(21) Appl. No.: 13/500,512

(22) PCT Filed: Sep. 29, 2010

(86) PCT No.: PCT/EP2010/064486
§ 371 (c)(1),
(2), (4) Date: Apr. 5, 2012

(87) PCT Pub. No.: WO2011/042346
PCT Pub. Date: Apr. 14, 2011

(65) Prior Publication Data
US 2012/0193537 A1    Aug. 2, 2012

(30) Foreign Application Priority Data
Oct. 5, 2009    (GB) .................................. 0917401.2

(51) Int. Cl.
*G01J 5/20* (2006.01)
*H01L 27/146* (2006.01)

(52) U.S. Cl.
CPC .......... *H01L 27/14634* (2013.01); *G01J 5/20* (2013.01); *H01L 27/1469* (2013.01); *G01J 2005/202* (2013.01); *H01L 27/14636* (2013.01); *H01L 27/14649* (2013.01)

(58) Field of Classification Search
CPC ........... G01J 2005/106; G01J 2005/202; G01J 2005/283; G01J 2005/345

USPC ...... 250/336.1, 338.1, 338.4, 339.02, 370.08
See application file for complete search history.

(56) References Cited

U.S. PATENT DOCUMENTS

| | | | |
|---|---|---|---|
| 4,464,776 A * | 8/1984 | Erker | 378/10 |
| 4,618,763 A * | 10/1986 | Schmitz | 250/214.1 |
| 5,635,718 A | 6/1997 | DePuydt et al. | |
| 2005/0109918 A1 * | 5/2005 | Nikzad | H01L 27/14683 250/208.1 |
| 2005/0178971 A1 | 8/2005 | Hoge | |

FOREIGN PATENT DOCUMENTS

| | | |
|---|---|---|
| DE | 195 13 678 A1 | 10/1996 |
| EP | 1 492 168 A1 | 12/2004 |
| WO | WO 2006/038213 A2 | 4/2006 |

OTHER PUBLICATIONS

International Search Report (PCT/ISA/210) issued on Feb. 25, 2011, by European Patent Office as the International Searching Authority for International Application No. PCT/EP2010/064486.
Written Opinion (PCT/ISA/237) issued on Feb. 25, 2011, by European Patent Office as the International Searching Authority for International Application No. PCT/EP2010/064486.

* cited by examiner

*Primary Examiner* — David Porta
*Assistant Examiner* — Carolyn Igyarto
(74) *Attorney, Agent, or Firm* — Buchanan Ingersoll & Rooney PC

(57) ABSTRACT

A large format array is described having a series of smaller arrays daisy chained together to form the larger array. The smaller arrays are mounted on a base plate that may be of a non planar configuration. The daisy chaining together of the smaller arrays enables a smaller number of connections to be made to the external interface via connections.

9 Claims, 2 Drawing Sheets

LARGE FORMAT ARRAYS AND METHODS

FIELD

The invention relates to a large format array. More specifically, but not exclusively, it relates to an infra red focal plane array comprising a number of smaller arrays, said smaller arrays being arranged in such a fashion so as to act as a larger array.

BACKGROUND

There is an increasing demand for larger infra red focal plane arrays (FPA) for a number of applications including space observation. The larger the array (for example 3000 by 3000 pixels) the more difficult it becomes to construct. Furthermore, errors in the focal plane array itself become increasingly likely. These properties also increase the cost of the arrays significantly.

Consequently it would be advantageous to be able to use smaller arrays to construct larger arrays by tessellating them together. This would give the advantage that they are significantly easier to manufacture and errors or defects in the focal plane arrays are less likely.

However, one of the main issues associated with using a number of smaller arrays linked together is the installation and operation of such a system. The main disadvantage is that each of the smaller arrays will require a large number of connecting, multiplexing and addressing wires and in the majority of applications the edges of the arrays need to be very closely aligned.

SUMMARY

This present invention proposes a solution to allow the advantages of building large arrays from smaller arrays to be combined with the ease of installation and operation of one single large array.

According to the invention there is provided a large format array comprising a plurality of separately addressable smaller arrays, said smaller arrays being mounted on a series of connectable plates so as to function as a single array when connected via suitable connections to suitable readout means.

BRIEF DESCRIPTION OF THE DRAWINGS

The invention will now be described with reference to the accompanying diagrammatic drawings in which.

DETAILED DESCRIPTION

Figure 1:
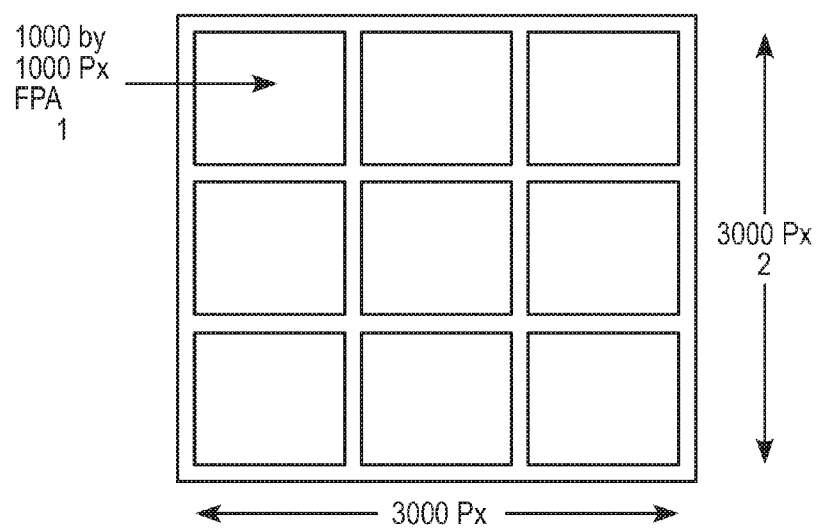
FIG. 1 is a schematic drawing of a large format array comprising a number of small focal plane arrays, in accordance with one form of the invention.

As shown in FIG. 1, a number of focal plane arrays (for example 1000 pixels by 1000 pixels) 1 are tessellated together to make a larger array (for example 3000 pixels by 3000 pixels) 2. These are mounted on a plate 3, which may be of any size (for example 3×3, 4×4, 16×16, N×M) and are connected together with a simple interface consisting of a low number of wires. The Low Voltage Differential Signalling (LVDS) standard is one such way of doing this, however any data transfer interface system that only has a small number of wires may be used. As a consequence, a very low number of external wires are used compared to a single large focal plane array which may use several tens if not hundreds of wires to the outside world. The smaller FPAs 1 are very closely butted together to a high degree of accuracy to create one large array 2.

Figure 2:
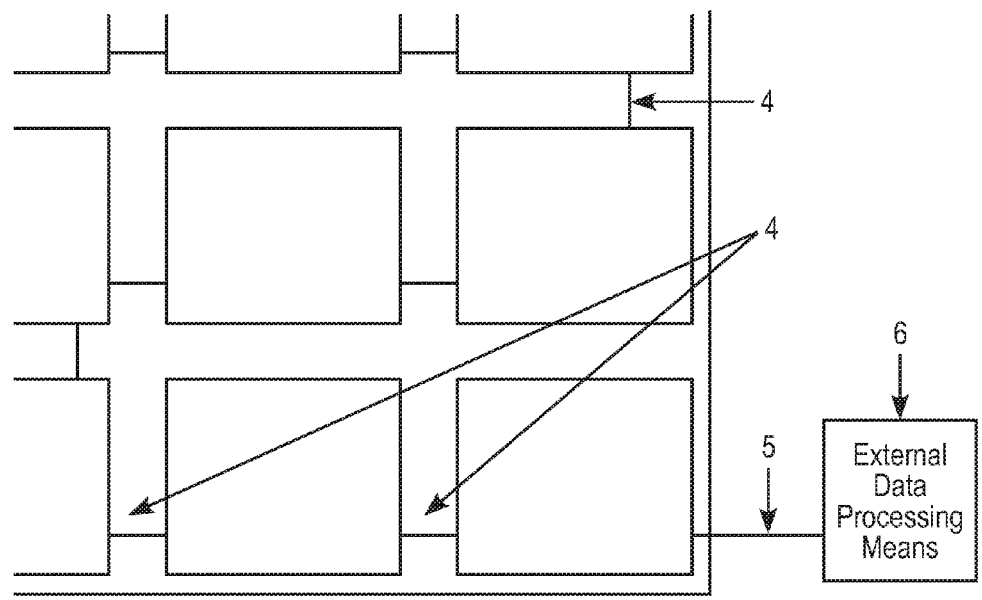
FIG. 2 is a close up of the array of FIG. 1, more clearly showing the connections between the smaller focal plane arrays.

One arrangement of connecting wires is shown in FIG. 2 where the individual smaller FPAs 1 are connected to each other in a chain configuration in a serial manner via suitable connecting wires 4. There is a simple connection 5 to the external data processing means 6.

Each of the smaller FPAs is provided with a unique predetermined programmable address held in an internal register. It is then not only possible to read out from them individually but also lay the plates on which they are mounted together to make very large patterns of arrays.

Figure 3:
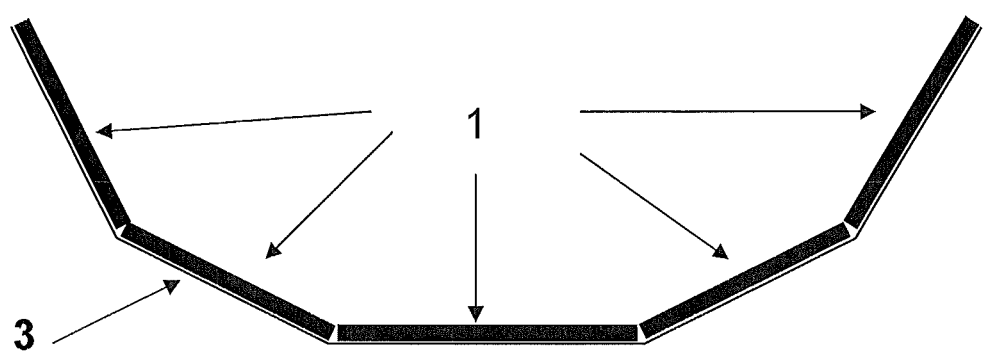
FIG. 3 is a schematic drawing showing a further form of large array comprising a number of smaller focal plane arrays mounted on a conformal base plate thereby allowing a curved structure of larger array.

As a result of this addressing and connecting method, it is possible for the system described to be integrated into a number of unique designs. For example, a conformal layout as shown in FIG. 3 is envisaged. As the FPAs 1 are mounted on plates and the plates can be any shape and do not have to be square or rectangular (unlike a large single array) more complex large arrays are envisaged. Furthermore, the plates 3 do not have to be flat and may be curved to suit the required optics.

Advantageously, the invention and its embodiments described above reduce the costs involved in producing a large format array as array cost (as a function of reducing site yield) increases with size, using smaller arrays to fabricate larger arrays is more cost efficient than building one large array. Additionally, the quality of arrays decreases with increasing size and the larger a single array becomes, the more opportunity there is for large clusters of defective pixels, increased single pixel defects and decreased uniformity—resulting in the more likely failure of a large array when compared with a number of smaller arrays.

Additionally, this method of construction provides the following system integration advantages.

In light of the low number of wires on the external interface, a faster more cost effective integration is achievable. Plates 3 may be connected together and then the final plate is connected to the necessary read out circuitry.

The time and cost of repairs to the large array 2 may be significantly reduced as it is possible to remove one array 1 on a plate 3 and replace it rather than replacing whole array 2. This is more cost effective than replacing one whole large array.

Furthermore, matching across plates 3 improves system uniformity. In light of the modular structure, it is possible to select arrays 1 to have highly uniform properties across a plate 3 or group of plates.

Moreover, customisation of the large array to the required optics is possible. Plates 3 can be made to any size or may be shaped for better performance.

Removal of butting losses: By laying the arrays on plates with high accuracy it is possible to remove the losses that may be present when tessellating very large arrays together.

Additionally, this method of construction provides the following functional possibilities. Firstly, It is possible to address each array 1, plate 3 or group of plates to allow read out of specific areas. Secondly, if removal or repair of an individual plate or array is not possible, addressing may be used to deselect faulty arrays until the plate can be sent for repair.

Accordingly, the method described above provides a technique for simplifying the construction, system installation and operation of large format infra-red focal plane arrays by tessellating smaller arrays together and connecting using a low number of wires. In addition, by using unique addressing for each of the smaller FPAs a number of additional functions may be implemented.

It will be appreciated that in one aspect of the invention, it is the addressing of the arrays that is important. i.e. each small array has an address within the bigger array and can be dealt with individually. In making big arrays from smaller arrays that smaller arrays do not need to be made in a specific shape, they can be 'jigsawed' together to form a circle, rectangle, L-shape or any other required format. In this way, a larger curved surface can be formed from a plurality of smaller flatter arrays. i.e. curves could be approximated by mounting the arrays on curved plates (or simply 'not flat' plates) and matching them to any variations in the optics if required.

It will be appreciated that daisy chaining the arrays together allows for numerous possibilities of large array shapes.

In the example described above, plates carry the connections. However, this does not have to be the case. The arrays do not have to be mounted on plates but it makes handling and replacement of said arrays easier if they are.

It will be appreciated that a number of smaller arrays may be mounted on a single plate and a number of plates then mounted together to form a required larger array shape. Advantageously this would make for simpler installation or replacement. However, a single smaller array may be mounted per plate if so desired.

The invention claimed is:

1. A large format Infra Red (IR) Focal Plane Array (FPA), comprising:
    a plurality of separately addressable smaller arrays, said smaller arrays being mounted on a series of separate connectable plates and configured to be connected via connections between said smaller arrays so as to function as a single, large FPA, the large FPA configured to be connected to an external data processor having read-out circuitry,
    wherein the smaller arrays are arranged and connected together in a chain configuration in a serial manner via the connections, each small array being connected to a maximum of two immediately adjacent small arrays,
    wherein the large FPA is configured to output signals from the plurality of separately addressable smaller arrays via a single output of one of the plurality of smaller arrays such that the output of the large FPA is connected to the external data processor via a single connection between the one of the plurality of smaller arrays and the external signal processor.

2. An array according to claim 1, wherein a single one of the smaller arrays is mounted on a single one of the plates, and said plates are connected together so as to function as a single array.

3. An array according to claim 2, wherein the plates are connected so as to form a larger non-planar array.

4. An array according to claim 1, wherein the plates are connected so as to form a larger non-planar array.

5. An array according to claim 1, wherein the smaller arrays are connected in a daisy chain fashion, said connections enabling a single connection to the external data processor.

6. An array according to claim 1, wherein each of the smaller arrays is respectively assigned a unique address to enable separate communication with each one of the smaller arrays, respectively.

7. A method of creating a large format Infra Red (IR) Focal Plane Array (FPA), the method comprising:
    connecting a series of separately addressable smaller infra red focal plane arrays together on a series of separate, connectable plates to form a single, large FPA,
    connecting the large FPA to an external data processor having read-out circuitry;
    separately addressing each of the smaller arrays; and
    reading out the data collected from the smaller arrays so that the connected smaller arrays function as a single array,
    wherein the smaller arrays are arranged and connected together in a chain configuration in a serial manner via the connections, each smaller array being connected to a maximum of two immediately adjacent smaller arrays, and
    wherein the large FPA is connected to the external data processor via a single connection between a single one of the plurality of smaller arrays and the external data processor.

8. A method according to claim 7, comprising:
    mounting said smaller arrays to function as a single array.

9. A method according to claim 7, wherein each of the smaller arrays is respectively assigned a unique address to enable separate communication with each one of the smaller arrays, respectively.

* * * * *